United States Patent [19]

Bassett et al.

[11] Patent Number: 4,463,215
[45] Date of Patent: Jul. 31, 1984

[54] CADMIUM SULPHIDE SOLAR CELL

[75] Inventors: Peter J. Bassett; Augustinus W. Verheijen, both of Brussels, Belgium

[73] Assignee: Prutec Limited, London, England

[21] Appl. No.: 473,140

[22] Filed: Mar. 7, 1983

[30] Foreign Application Priority Data

Mar. 8, 1982 [EP] European Pat. Off. ........ 82301152.3

[51] Int. Cl.$^3$ .................... H01L 31/06; H01L 31/18
[52] U.S. Cl. .................................... 136/244; 29/572; 29/588; 136/259; 136/260; 357/30; 357/67; 427/74
[58] Field of Search .................. 29/572, 588; 427/74, 427/88, 91; 136/260, 244, 259; 357/30, 67

[56] References Cited

U.S. PATENT DOCUMENTS

| | | | |
|---|---|---|---|
| 4,104,420 | 8/1978 | Jordan et al. | 427/74 |
| 4,239,553 | 12/1980 | Barnett et al. | 136/256 |
| 4,251,286 | 2/1981 | Barnett | 136/260 |
| 4,260,428 | 4/1981 | Roy | 136/260 |
| 4,267,398 | 5/1981 | Rothwarf | 136/256 |
| 4,283,590 | 8/1981 | Bilger et al. | 136/251 |
| 4,318,938 | 3/1982 | Barnett et al. | 427/75 |

OTHER PUBLICATIONS

K. Bogus et al., "High Efficiency Cu$_2$S/CdS Solar Cells with Improved Thermal Stability", *Proceedings*, 9th *IEEE Photovoltaic Specialists Conf.*, (1972), pp. 106–110.
P. Pfisterer et al., "Performance of Cu$_x$S/CdS Solar Cells After Additional Cu Treatment," Proceedings, 11th *IEEE Photovoltaic Specialists Conf.*, (1975), pp. 460–463.
P. Pfisterer et al., "Post-Fabrication Treatments, Surface Properties, and Front Contact of Cu$_x$S/CdS Solar Cells," *Proceedings*, 12th *IEEE Photovoltaic Specialists Conf.*, (1976), pp. 504–507.
P. Pfisterer et al., "Improvement of Efficiency and Stability by Cu-Treatment and Front Contacting of Cu$_x$S/CdS Solar Cells," *Sun*, Pergamon Press (1978), pp. 670–674.
P. Pfisterer et al., pp. 762–766, in "Proceedings, 3rd E. C. Photovoltaic Solar Energy Conference (1980)," Reidel Pub. Co. (1981).
W. Arndt et al., pp. 798–802, in "Proceedings, 3rd E. C. Photovoltaic Solar Energy Conference (1980)," Reidel Pub. Co. (1981).
W. H. Bloss et al., "Cu$_2$S/CdS Thin Film Solar Cells," *Conf. Record*, 14th *IEEE Photovoltaic Specialists Conf.* (1980), pp. 287–290.

*Primary Examiner*—Aaron Weisstuch
*Attorney, Agent, or Firm*—Holman & Stern

[57] ABSTRACT

The invention relates to the manufacture of cadmium sulphide solar cells.

A cell is formed of a glass substrate 10, a front contact 12 made, for example, of tin oxide, a cadmium sulphide layer 14 and a copper sulphide layer 16. the junction between the layers 14 and 16 is photovoltaic. In order to form a rear contact 18 on the copper sulphide layer, the invention proposes vapor depositing a mixed layer of copper and copper oxide onto the sulphide layer. The invention also describes a method of heat treatment following the formation of the rear contact in order to optimise the electrical performance of the cell.

15 Claims, 2 Drawing Figures

CADMIUM SULPHIDE SOLAR CELL

FIELD OF THE INVENTION

The present invention relates to cadmium sulphide solar cells and the their manufacture.

DESCRIPTION OF PRIOR ART

The preliminary stages in the construction of a cadmium sulphide solar cell will first be described by reference to FIG. 1 of the accompanying drawings which shows a section through a partly constructed solar cell.

A substrate 10, made for example of glass, is coated with a material such as tin oxide or indium tin oxide to form a transparent front contact 12. A cadmium sulphide layer 14 is next formed to overlie the contact 12. This last step may be achieved by way of several techniques including vapor deposition, sputtering, sintering and spraying. Each of these techniques has its attendant advantages and disadvantages in terms of deposition rates and grain size, which affect the manufacturing cost and the cell performance. In the preferred technique, a precursor solution is sprayed onto the preheated substrate.

The next step involves the formation of a copper sulphide layer and again more than one technique can be employed to achieve this step. In the preferred method, the substrate is made to react with a solution containing copper ions, for example by dipping, with the result that the upper surface of the cadmium sulphide layer 14 is converted into a copper sulphide layer 16 to form between the layers 14 and 16 a photovoltaic junction. The copper sulphide layer is not stoichiometric, there being slightly less than two atoms of copper for each sulphur atom.

It now remains to form the rear contact to make ohmic contact with the copper sulphide layer 16. It has already been attempted to form a layer of pure copper over the copper sulphide layer 16 by vapor deposition of a thick film. This method, however, has the disadvantage that the maximum current output (short circuit current) of the cell is considerably reduced due to an apparent increase in the internal resistance of the cell.

An explanation for the apparent increase in the internal resistance of the cell is to be found in a paper by E. Pfisterer et al on page 762 of the *Proceedings of the International Conference on Photovoltaic Solar Energy* held in Cannes, France on the 27th to the 31st of Oct. 1980. This paper, which is the result of work carried out in the University of Stuttgart, suggests that the copper to copper sulphide interface constitutes a Schottky barrier which adversely affects the efficiency of the cell.

The solution proposed by the Stuttgart University research team comprises the reduction of the surface of the copper sulphide layer to pure copper by exposing the layer to a hydrogen glow discharge and subsequently heating the pure copper layer in air to reoxidise the copper. By this combination of steps, the surface of the copper sulphide layer is converted to copper oxide which does not set up a Schottky barrier with the copper sulphide layer.

While this proposal has been successful in improving the efficiency of the cell, it still suffers from disadvantages from the point of view of large scale manufacture. Most of the disadvantages stem from the fact that one cannot readily make ohmic contact with the thin film of copper oxide because the sheet resistivity of the film is high and because it is difficult to solder directly onto it.

The cell proposed by the researchers at Stuttgart University consists of a glass sandwich in which the lower glass plate carries the cadmium sulphide layer and the second glass plate carries a gold-plated copper grid to be mechanically pressed against the film type copper oxide layer on the individual cells to establish the desired contact. A gold plating is required in order that the contact should be ohmic.

The construction of this glass sandwich is described in the paper given at the same conference by W. Arndt et al, entitled "Integrated Copper Sulphide Cadmium Sulphide Thin Film Solar Cell Panels With Higher Output Voltages". Although this construction is alleged to have certain merits from the point of view of long term operation (see the paper of W. H. Bloss et al at the same conference) it will be seen that the manufacture of the rear contact involves as many steps as the manufacture of the entire cell. In addition to this, the contact grid must, as previously mentioned, be coated with gold, which adds still further to the cost of manufacture. The glass sandwich also imposes limitations on the size of the panels since pressure must be applied to all the cells in the panel to keep the contact grid against the copper oxide layers.

The present invention seeks to provide a method of establishing contact with the copper sulphide layer of a cadmium sulphide cell which is less expensive to implement than the previously proposed methods and yet does not seriously affect the performance of the solar cell.

SUMMARY OF THE INVENTION

In accordance with the present invention, there is provided a method of establishing electrical contact with the copper sulphide layer of a cadmium sulphide-copper sulphide solar cell, in which a thick copper and copper oxide layer is deposited onto the copper sulphide layer.

Hitherto, in depositing copper onto the copper sulphide layer care has been taken always to maintain the layer as pure as possible. By contrast, the present invention proposes introducing oxygen into the system during evaporation in order to provide a mixed co-deposit of copper and copper oxide at the interface with the copper sulphide in order to avoid the Schottky barrier effect. By virtue of the deposition of this thick copper containing layer one can now solder leads directly onto the copper containing layers and any desired form of encapsulation can be employed to ensure the long term stability of the cells. Furthermore, the copper containing layer, being in the form of a thick film, has a lower sheet resistance than the thin film in the prior art so that it is no longer essential for the contact to be made over the full area of the layer.

Preferably, after vapor deposition of the copper containing layer, the cell is subjected to a heat treatment by heating in air for a predetermined time. A heat treatment consisting of heating to 150° C. for ten minutes have been found to optimize the efficiency of the cell. The purpose of the heat treatment, it is believed, is to cause migration of copper so as to improve the stoichiometry of the copper sulphide layer to provide high diffusion length of minority carriers. The temperature at which the heat treatment is carried out and the duration of exposure to oxygen are important, because upon exceeding the optimum heat treatment, the efficiency of the cell once again decreases due to the formation of cupric, rather than cuprous, oxides. Since cupric oxide is an insulator, the sheet resistivity of the material also increases as the concentration of cupric ions increases.

The advantages of the heat treatment have already been discussed in the papers mentioned above but it should be noted that the additional mixed deposit of copper and copper oxide vapor co-deposited in accordance with the present invention provides a copper reservoir from which copper ions can be drawn to improve the stoichiometry of the copper sulphide layer.

BRIEF DESCRIPTION OF THE DRAWINGS

The invention will now be described further, by way of example, with reference to the accompanying drawings, in which.

DESCRIPTION OF THE PREFERRED EMBODIMENT

Figure 1:
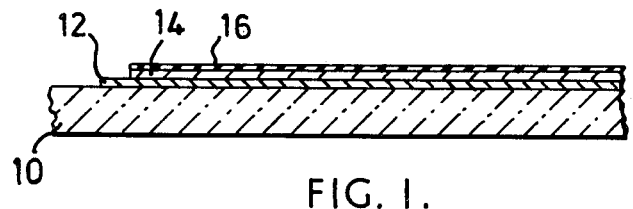
FIG. 1 is, as previously described, a schematic section through a partly constructed solar cell.
Figure 2:
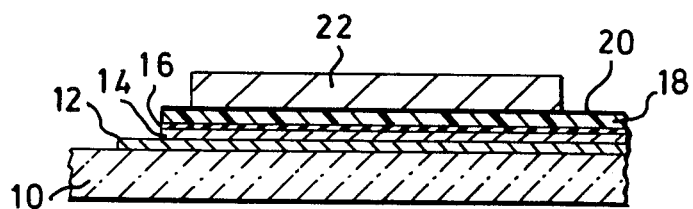
FIG. 2 shows a section through a solar cell of the invention.

In FIG. 2, the layers 10, 12, 14 and 16 are formed in the manner previously described by reference to FIG. 1. Layer 18 is a mixed deposit of copper and copper oxide formed by a co-deposition technique, such as vapor co-deposition. The copper vapor is deposited on the copper sulphide layer 16 in an oxygen-containing atmosphere, the temperature and the oxygen concentration being such that a mixed layer containing cuprous oxide is deposited as a thick film over the copper sulphide layer. As seen in FIG. 2, layer 18 is thicker than copper sulphide layer 16. If desired, the oxygen concentration can be reduced as the film thickness is built up to give a greater oxygen concentration at the interface with the copper sulphide than at the upper surface, as viewed, of the layer.

Following the deposition of the mixed copper and copper oxide layer, the substrate is heat treated to a temperature of approximately 150° C. for ten minutes in air. This heat treatment results in a significant improvement in the electrical performance of the cell, believed to be the result of improvement in the stoichiometry of the copper sulphide layer as a result of migration of copper ions from the copper oxide layer. In order to illustrate the improvement achieved in cell performance achieved by the present invention, the open circuit voltage and the short circuit current of a cell measuring 1 cm. × 1 cm. will now be considered. In the case of a cell produced by depositing copper directly onto the copper sulphide layer, the maximum open circuit voltage amounted to 2 milliamps. In a cell which, according to the invention, has a mixed copper and copper oxide layer co-deposited onto the copper sulphide layer, prior to heat treatment the open circuit voltage is 150 mV. but the short circuit current is now 5 mA. After heat treatment the open circuit voltage rises to 450 mV. and the short circuit current rises to 15 mA.

Any of several methods may now be employed to establish ohmic contact with the mixed copper and copper oxide layer 18. In FIG. 2, there is shown a layer of solder 20 which can be applied in a conventional manner and a copper output electrode 22. The output electrode 22 may form part of a thick film deposited grid connecting the cells of a panel in series, in parallel, or in any desired grouping to achieve the desired output current and output voltage.

Following the formation of the output electrodes, the upper surface of the cell can be coated with, for example, an epoxy resin in order to prevent contamination and offer mechanical protection to the cell. Such a method of encapsulation assures the long term stability of the cell while being less expensive to implement than the so-called "glass sandwich" described above.

While the invention has been described by reference to a particular embodiment, it will be clear to those skilled in the art that various modification may be brought thereto without departing from the spirit and scope of the invention as set forth in the appended claims.

We claim:

1. A method of establishing electrical contact with the copper sulphide layer of a cadmium sulphide-copper sulphide solar cell, in which a mixture of copper and cuprous containing copper oxide in a layer thicker than said copper sulphide layer is co-deposited onto the copper sulphide layer to make ohmic contact with the copper sulphide layer.

2. In a method of manufacturing a cadmium sulphide solar cell, comprising the steps of:
   forming a front contact by coating a transparent substrate with an electrically conductive transparent material;
   forming over the front contact a layer of cadmium sulphide;
   forming a copper sulphide layer over the cadmium sulphide layer to produce a photovoltaic junction; and
   forming a rear contact on the copper sulphide layer; the improvement wherein
   the rear contact is formed by co-depositing onto the copper sulphide layer a mixed layer of copper and cuprous containing copper oxide.

3. The method set forth in claim 2, in which, following deposition of the copper and copper oxide layer, the cell is subjected to a heat treatment to cause migration of copper ions in order to improve the electrical performance of the cell.

4. The method set forth in claim 3, wherein the heat treatment comprises heating the cell at a temperature of 150° C. for ten minutes in air.

5. The method set forth in claim 2, wherein following the formation of the rear contact, the cell is encapsulated.

6. The method set forth in claim 2, wherein the copper oxide consists essentially of cuprous oxide.

7. The method set forth in claim 2, wherein ohmic contact is established with said mixed layer by bonding a copper output electrode thereto by means of a solder layer.

8. The method set forth in claim 7, wherein said output electrode forms part of a film deposited grid connecting a plurality of said solar cells.

9. A cadmium sulphide solar cell manufactured by the method of claim 2.

10. A cadmium sulphide solar cell manufactured by the method of claim 3.

11. A cadmium sulphide solar cell manufactured by the method of claim 4.

12. A cadmium sulphide solar cell manufactured by the method of claim 5.

13. A cadmium sulphide solar cell manufactured by the method of claim 6.

14. A cadmium sulphide solar cell manufactured by the method of claim 7.

15. A panel comprising a plurality of cadmium sulphide solar cells manufactured by the method of claim 8.

* * * * *